United States Patent
Cheng et al.

(10) Patent No.: US 10,068,807 B2
(45) Date of Patent: Sep. 4, 2018

(54) UNIFORM SHALLOW TRENCH ISOLATION

(71) Applicant: International Business Machines Corporation, Armonk, NY (US)

(72) Inventors: Kangguo Cheng, Schenectady, NY (US); Junli Wang, Slingerlands, NY (US); Peng Xu, Guilderland, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/406,904

(22) Filed: Jan. 16, 2017

(65) Prior Publication Data

US 2018/0204774 A1   Jul. 19, 2018

(51) Int. Cl.
| | | |
|---|---|---|
| *H01L 21/82* | (2006.01) | |
| *H01L 21/76* | (2006.01) | |
| *H01L 21/8234* | (2006.01) | |
| *H01L 21/762* | (2006.01) | |
| *H01L 29/78* | (2006.01) | |

(52) U.S. Cl.
CPC ........ *H01L 21/823481* (2013.01); *H01L 21/76224* (2013.01); *H01L 21/76229* (2013.01); *H01L 21/823431* (2013.01); *H01L 29/7846* (2013.01)

(58) Field of Classification Search
CPC ....... H01L 21/823481; H01L 21/76229; H01L 29/7846; H01L 21/76224; H01L 21/823431
USPC ....................................................... 438/427
See application file for complete search history.

(56) References Cited

U.S. PATENT DOCUMENTS

| | | | |
|---|---|---|---|
| 6,876,053 B1 | 4/2005 | Ma et al. | |
| 6,974,981 B2 | 12/2005 | Chidambarrao et al. | |
| 8,673,723 B1 | 3/2014 | Na | |
| 8,969,155 B2 | 3/2015 | Cheng et al. | |
| 8,987,790 B2 | 3/2015 | Cheng et al. | |
| 8,993,417 B2 | 3/2015 | Tsai et al. | |
| 9,245,979 B2 | 1/2016 | Cai et al. | |
| 9,299,705 B2 | 3/2016 | Kanakasabapathy | |
| 9,318,392 B1 | 4/2016 | Leobandung | |
| 2004/0113174 A1 | 6/2004 | Chidambarrao et al. | |
| 2009/0008727 A1 | 1/2009 | Yamauchi et al. | |
| 2015/0060959 A1 | 3/2015 | Lin et al. | |
| 2015/0102409 A1* | 4/2015 | Cheng | H01L 29/66795 257/347 |

OTHER PUBLICATIONS

List of IBM Patents or Patent Applications Treated as Related; (Appendix P), Filed Jan. 16, 2018; 2 pages.
Kangguo Cheng et al., "Uniform Shallow Trench Isolation", U.S. Appl. No. 15/872,142, filed Jan. 16, 2018.

* cited by examiner

*Primary Examiner* — Caleen Sullivan
(74) *Attorney, Agent, or Firm* — Cantor Colburn LLP

(57) ABSTRACT

A method for forming a field-effect transistor (FET) including forming a plurality of individual fins on a substrate. The method continues with forming a dummy anchor structure, with the dummy anchor located outside the outermost fin. The fins and dummy anchor define a trench, where the trench has a width dimension. The method continues with depositing a shallow trench isolation (STI) material into the trench and between the fins, where the STI material places uniform tension stresses on both sides of the individual fins.

9 Claims, 7 Drawing Sheets

UNIFORM SHALLOW TRENCH ISOLATION

BACKGROUND

The present invention generally relates to complementary metal-oxide-semiconductor (CMOS) fabrication methods and related structures. More specifically, the present invention relates to fabrication methods and resulting device architectures for uniform shallow trench isolation (STI) fill regions formed around fin structures on a CMOS device.

Semiconductor devices are typically formed using active regions of a wafer. The active regions are defined by isolation regions (e.g., STI) used to separate and electrically isolate adjacent semiconductor devices. In contemporary fin-based CMOS device fabrication processes, the fins can bend if unequal masses of STI fill regions are around the fin structures. It is undesirable for fin structures to bend during fabrication of a fin-based CMOS device.

SUMMARY

Embodiments are directed to a method for forming a field-effect transistor (FET). The method includes forming a plurality of individual fins on a substrate and forming a dummy anchor structure, where the dummy anchor is located outside the outermost fin. The method also includes defining a trench between the outermost fin and the dummy anchor, where the trench has a width dimension. The method also includes depositing a shallow trench isolation (STI) material into the trench and between the fins, where the STI material places uniform tension stresses on both sides of the individual fins.

Embodiments are also directed to a field-effect transistor (FET) device that includes a plurality of individual fins on a substrate and a dummy anchor structure, where the dummy anchor is located outside the outermost fin. The device also includes a trench, which is defined as the region between the outermost fin and the dummy anchor, and where the trench has a width dimension. The device also includes a shallow trench isolation (STI) material deposited into the trench and between the fins.

BRIEF DESCRIPTION OF THE DRAWINGS

The subject matter of embodiments of the present invention are particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
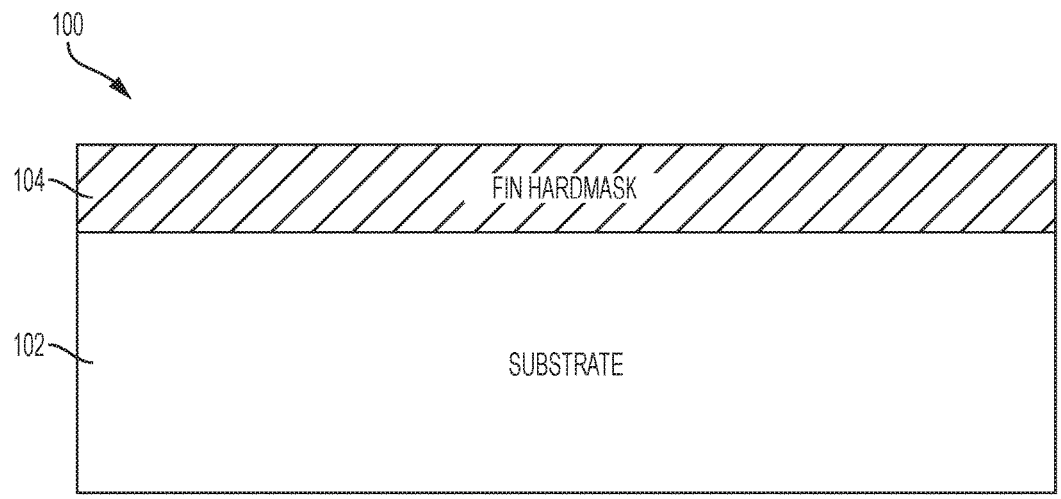
FIG. 1 depicts a cross-sectional view of a semiconductor structure according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e.

two, three, four, five, etc. The term "connection" can include an indirect "connection" and a direct "connection".

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication can be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of aspects of the present invention, depositing STI material around fin structures is one method of forming CMOS FET structures. However, the presence of STI materials adjacent to fin structures can create asymmetrical tension forces on either side of an individual fin, and can cause the fin to lean or bend over from the strain. Embodiments described herein provide methods and devices for forming fin structures using STI materials and processes by forming and using dummy anchors. The dummy anchors allow for uniform distribution of STI materials in key areas, thus avoiding asymmetrical stresses, and therefore maintaining the vertical orientation of fin structures.

Methods and devices described herein discuss embodiments of forming features of a field-effect transistor (FET) using dummy anchors and STI material according to embodiments of the present invention are described in detail below by referring to the accompanying drawings in FIGS. 1-12. FIG. 1 depicts a cross-sectional view of a semiconductor structure 100 according to one or more embodiments of the present invention. The structure 100 includes a semiconductor substrate 102 and a fin hard mask 104. The fin hard mask 104 is made of silicon nitride (SiN), but other embodiments are possible, and the fin hard mask 104 can be made with other materials. In other embodiments, the fin hard mask 104 can be formed from the same material as the substrate 102. The substrate 102 can include silicon, germanium, silicon germanium, silicon carbide, and those consisting essentially of III-V compound semiconductors. Other suitable substrates include II-VI compound semiconductors. The substrate 102 can also include an organic semiconductor or a layered semiconductor such as, for example, Si/SiGe, a silicon-on-insulator, or a SiGe-on-insulator. A portion or the entire substrate 102 can be amorphous, polycrystalline, or monocrystalline. The substrate 102 can be doped or undoped, or contain doped regions and undoped regions therein. The substrate 102 can also contain regions with strain and regions without strain therein, or contain regions of tensile strain and compressive strain.

Figure 2:
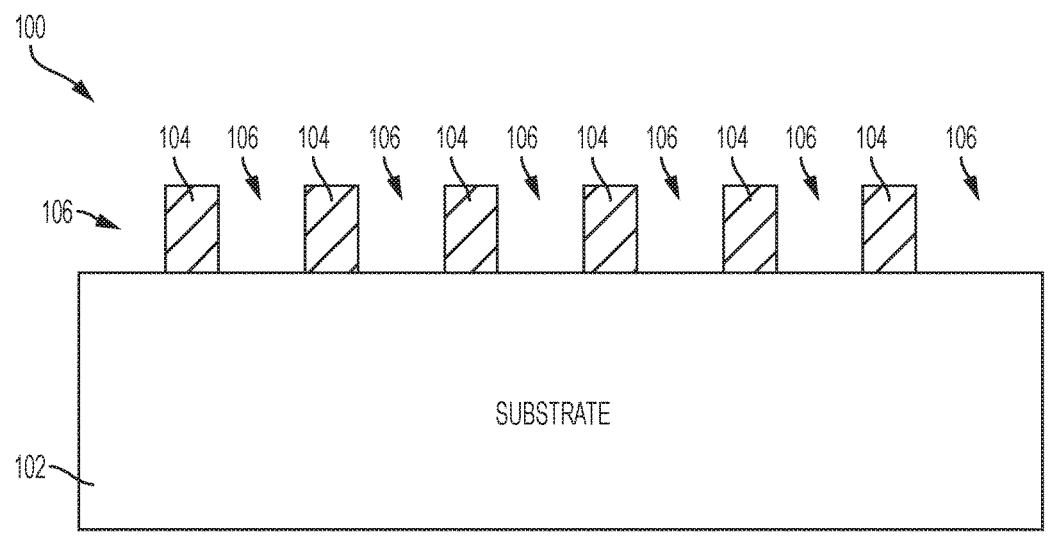
FIG. 2 depicts a cross-sectional view of the structure after etching a fin hard mask according to one or more embodiments of the present invention.

FIG. 2 depicts a cross-sectional view of the structure 100 after etching the fin hard mask according to one or more embodiments of the present invention. FIG. 2 is a continuation of the processes discussed in FIG. 1. A pattern is placed over the structure 100 and an etching process is performed. Two methods of etching to remove material from the structure 100 include gas phase hydrofluoric acid (HCl), and a wet etch process with an etchant containing ammonia and hydrogen peroxide. Alternatively, the etching process can include, but is not limited to, a directional anisotropic reactive-ion etching (RIE) process. Embodiments of the present invention are not limited as to the specific process applied for etching the structure, and other processes are possible. Other embodiments of the present invention can apply different etching processes and are not limited herein. The pattern to form a fin hard mask structure 104 can use a self-aligned double pattern (SADP) mask. Alternatively, the pattern can be a self-aligned quadruple pattern (SAQP) mask. The etching process removes portions of the fin hard mask 104 down to the substrate 102 and forms one or more individual fin hard masks 104, with each fin hard mask 104 in a parallel arrangement with the other fin hard masks 104. The etching process, after removing material from the structure 100, also creates a plurality of trenches 106 that are located between the fin hard masks 104 and extend downwards to the substrate 102.

Figure 3:
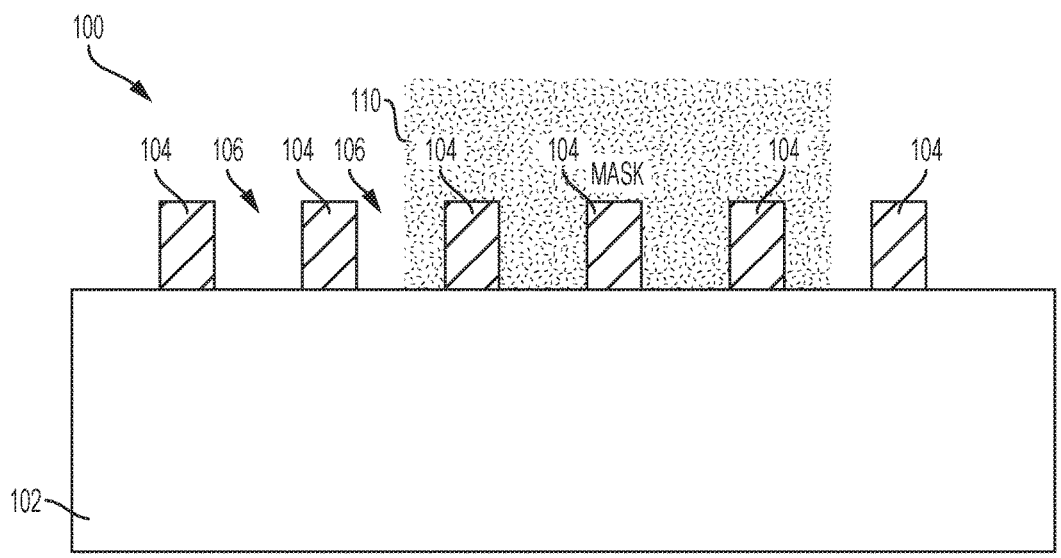
FIG. 3 depicts a cross-sectional view of the structure with a mask deposited over the fin hard masks according to one or more embodiments of the present invention.

FIG. 3 depicts a cross-sectional view of the structure 100 with a mask deposited over the fin hard masks according to one or more embodiments of the present invention. FIG. 3 is a continuation of the processes discussed in FIG. 2. A fin cut mask 110 is placed over a selection of fin hard masks 104. The fin cut mask 110 pattern isolates those fin hard masks 104 that are pre-selected to remain while allowing other fin hard masks 104 to be exposed to a future removal process, as described in the following figures. Those fin hard masks 104 not under the fin cut mask 110 will remain exposed.

Figure 4:
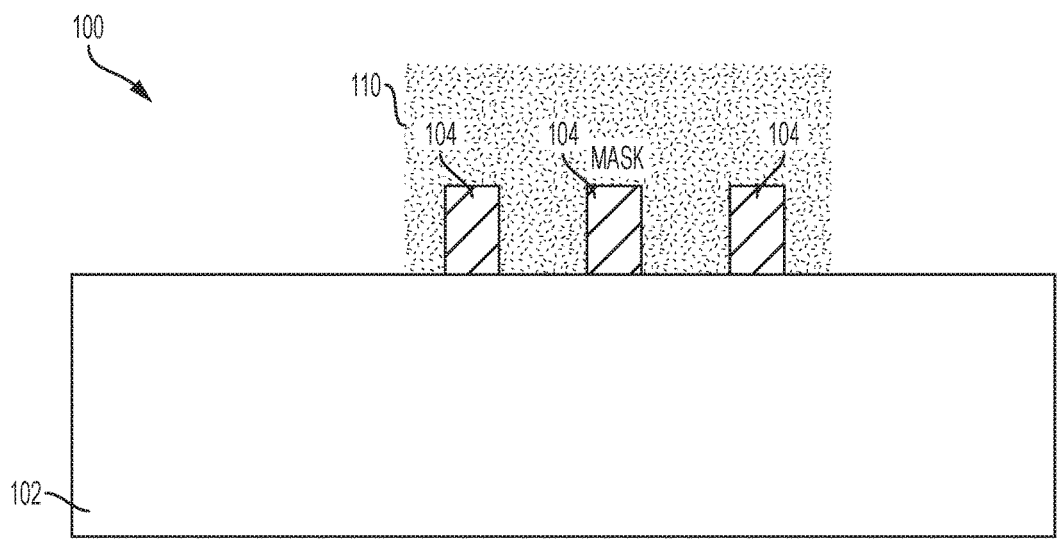
FIG. 4 depicts a cross-sectional view of the structure after fin hard masks are removed from the structure according to one or more embodiments of the present invention.

FIG. 4 depicts a cross-sectional view of the structure 100 after fin hard masks are removed from the structure according to one or more embodiments of the present invention. FIG. 4 is a continuation of the processes discussed in FIG. 3. The structure 100 is shown after pre-selected fin hard masks 104 are removed by an etching process as described in FIG. 2. In some embodiments, an additional method to remove the fin hard masks 104 includes a conformal dry etch process.

Figure 5:
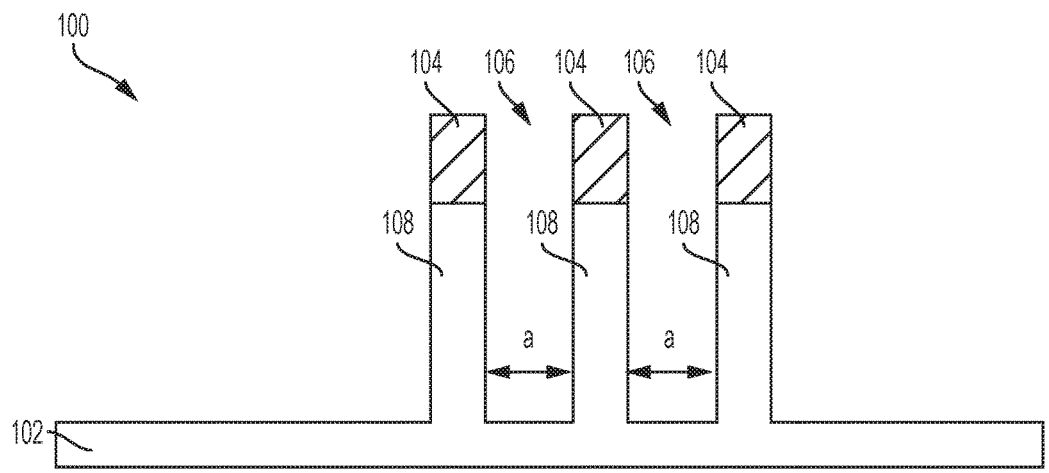
FIG. 5 depicts a cross-sectional view of the structure after removing a portion of the substrate material to create fins according to one or more embodiments of the present invention.

FIG. 5 depicts a cross-sectional view of the structure 100 after removing a portion of the substrate material to create fins according to one or more embodiments of the present invention. FIG. 5 is a continuation of the processes discussed in FIG. 4. The structure 100 is shown after removing the fin cut mask 110 and portions of the substrate 102 by the same or a different etching process as discussed in FIG. 2, where the etching process creates a plurality of fins 108, also known as a "fin structure". The trenches 106 are present between the fins 108 and are ready to receive material. The resulting structure 100 includes the substrate 102 with a plurality of fins 108 with each fin 108 exhibiting an extended length, and each fin 108 topped with the fin hard mask 104. The fins 108 are positioned with a uniform distance "a" between each fin 108.

Figure 6:
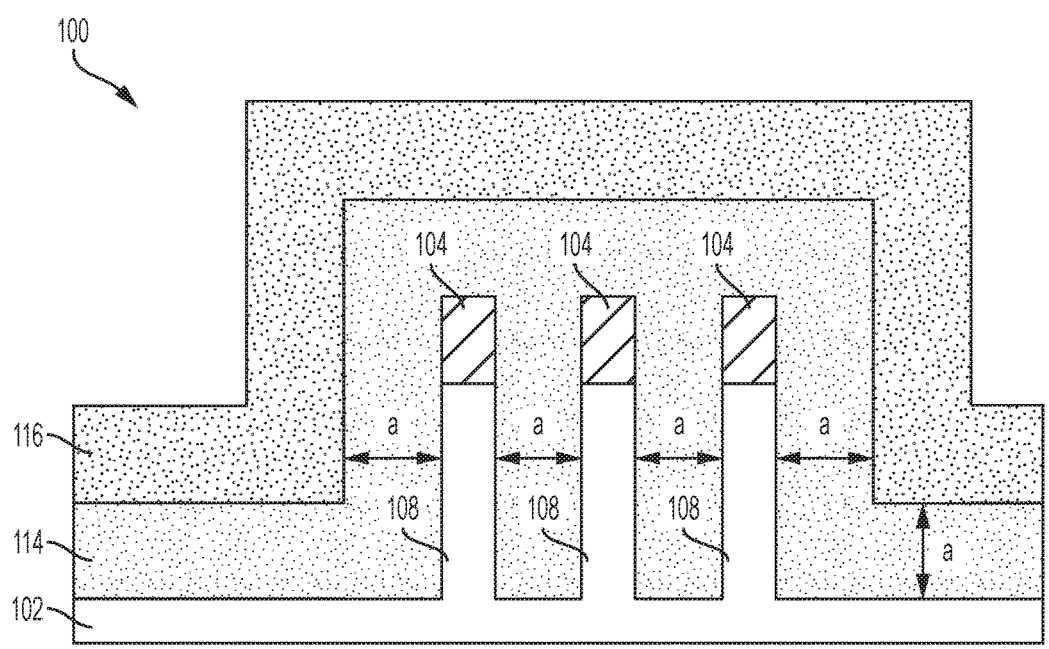
FIG. 6 depicts a cross-sectional view of the structure with a first liner and a second liner according to one or more embodiments of the present invention.

FIG. 6 depicts a cross-sectional view of the structure 100 with a first liner 114 and a second liner 116 according to one or more embodiments of the present invention. FIG. 6 is a continuation of the processes discussed in FIG. 5. The first liner 114 is conformally deposited onto the structure 100 in a uniform layer with a thickness of dimension "a", "a" being the dimensional value of the spacing between two adjacent fins 108. With the first liner 114 being applied with a thickness "a", both sides of the plurality of fins 108 are surrounded by the same amount of first liner 114 material. First liner 114 is formed of, but is not limited to, silicon-boron-carbon-nitride (SiBCN). The second liner 116 is then conformally deposited on top of the first liner 114. The second liner 116 is formed of, but is not limited to, silicon-carbon-oxide (SiCO). Combined, the first liner 114 and the second liner 116 make up the materials to form a plurality of dummy anchors as discussed in the following figures.

Figure 7:
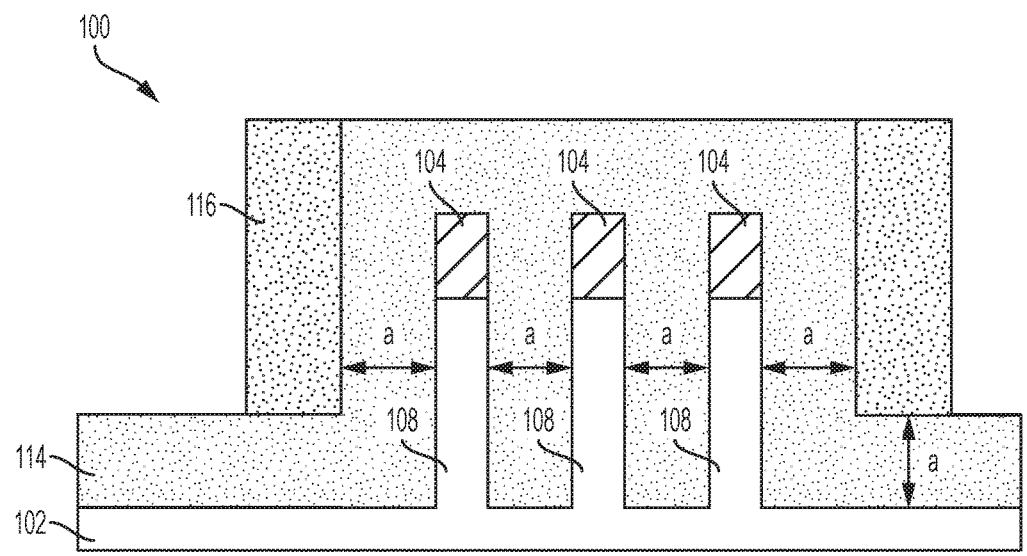
FIG. 7 depicts a cross-sectional view of the structure after removing portions of the second liner according to one or more embodiments of the present invention.

FIG. 7 depicts a cross-sectional view of the structure 100 after removing portions of the second liner according to one or more embodiments of the present invention. FIG. 7 is a continuation of the processes discussed in FIG. 6. The structure 100 is shown after removing portions of the second liner 116 by the same or a different etching process as discussed in FIG. 2. In other embodiments, portions of the second liner 116 can be removed by a planarization process.

Figure 8:
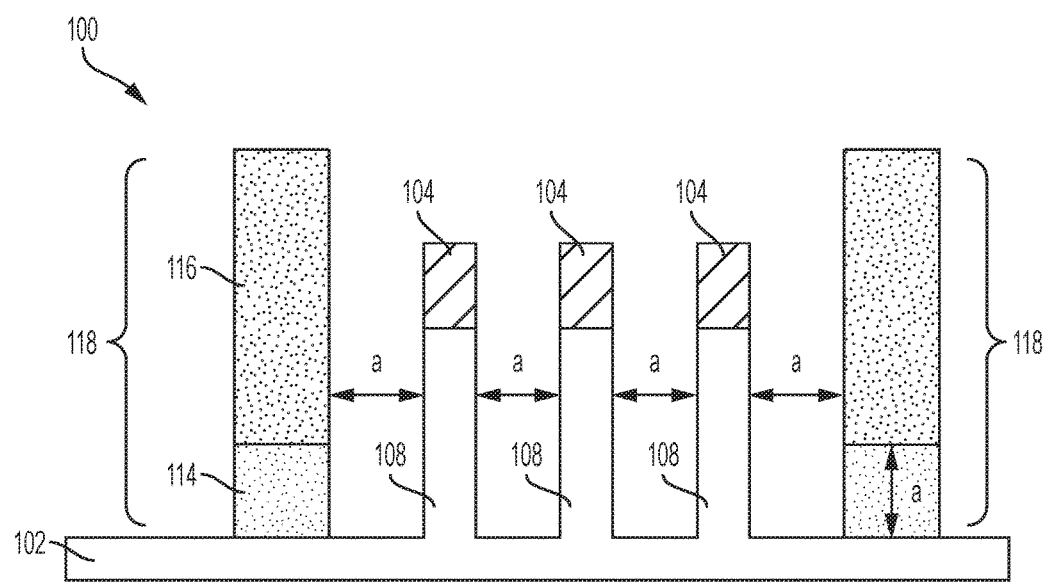
FIG. 8 depicts a cross-sectional view of the structure after removing portions of the first liner to form dummy anchors according to one or more embodiments of the present invention.

FIG. 8 depicts a cross-sectional view of the structure 100 after removing portions of the first liner to form dummy anchors according to one or more embodiments of the present invention. FIG. 8 is a continuation of the processes discussed in FIG. 7. The structure 100 is shown after removing portions of the first liner 114 by the same or a different etching process as discussed in FIG. 2 in order to form a plurality of dummy anchors 118. The first liner 114 material is also removed from areas adjacent to the fins 108 all the way downward to the surface of the substrate 102. The resultant structure 100 now includes dummy anchors 118, formed from the first liner 114 material and the second liner 116 material. Note that the dummy anchors 118 are located linearly outwards from the outermost fins 108 and are located a distance "a" away from the nearest fin 108.

In an alternative embodiment, the dummy anchors 118 can be located a variable distance away from the outmost fins 108. In some embodiments, it can be desirable to locate the dummy anchors 118 closer to, or further from, a distance "a" from the fins 108 as described in FIG. 5. In these embodiments, a dummy anchor 118 placed closer to the outermost fin 108 will result in a smaller trench 106 (of FIG. 5). Likewise, placing the dummy anchor 118 further away from the outermost fin 108 will result in a larger trench 106 (of FIG. 5). Placing the dummy anchors 118 in a predetermined location on the substrate in relation to the plurality of individual fins 108 allows the designer flexibility to compensate for local variances in fin fabrication as needed.

Figure 9:
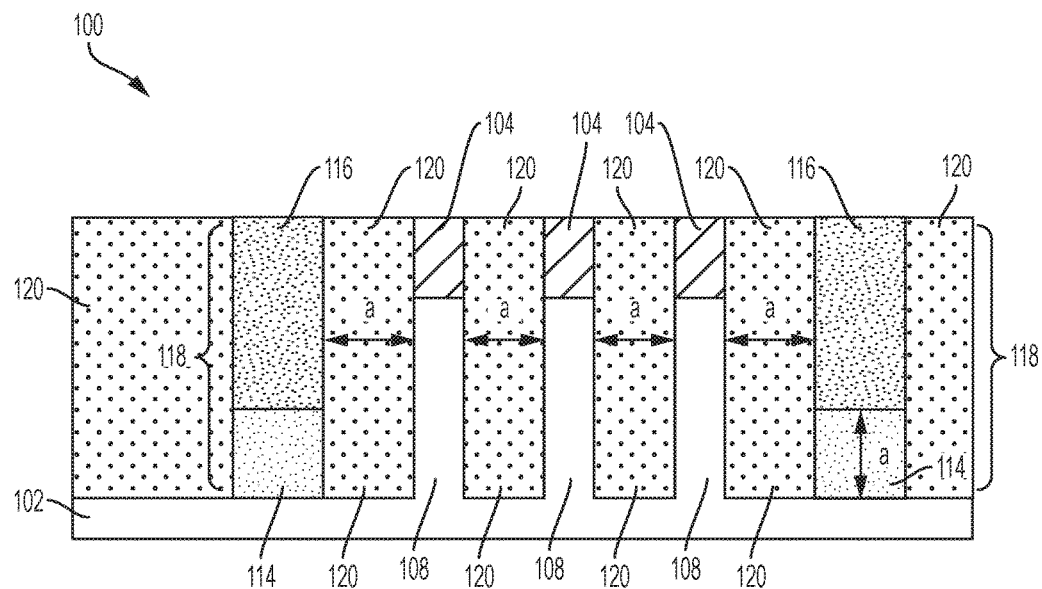
FIG. 9 depicts a cross-sectional view of the structure after depositing a shallow trench isolation (STI) material according to one or more embodiments of the present invention.

FIG. 9 depicts a cross-sectional view of the structure 100 after depositing shallow trench isolation (STI) material according to one or more embodiments of the present invention. FIG. 9 is a continuation of the processes discussed in FIG. 8. A STI material 120 is deposited onto the structure 100. The STI material 120 can be made of a flowable oxide. In some embodiments, after deposition of the STI material 120, a planarization process can take place to remove unwanted material overfill off of the structure 100. Once emplaced onto the structure 100, the STI material 120 exerts a tensional stress to surrounding structures, including the fins 108. In one or more embodiments, this tensional stress causes fins to "bend" and move away from each other. In the center region of the fins 108, stresses caused by the STI material 120 cancel each other out, as they are opposing forces of equal magnitude, with no appreciable movement of the fins 108. However, in those applications where no dummy anchors 118 are employed (e.g. on the outer regions of the fins 108), STI material 120 can be deposited in unequal amounts, causing STI-created tensional stress in one direction. This stress can cause the outlying fins 108 to bend outward in a "fan" or "open-book" shape, both distorting the fins 108 and occluding onto other structures on the substrate 102. The dummy anchors 118 allow for identical amounts of STI material 120 to be applied on both sides of all of the fins 108, including the outermost fins. Placing identical amounts of STI material 120 around all of the fins 108 is possible through spacing the dummy anchors 118 a distance "a" away from the outermost fins 108. The resultant structure 100 possesses a plurality of fins 108 surrounded by identical amounts of STI material 120, where tensional stresses to the fins 108 are cancelled out and prevents distortion to the fins 108 themselves.

STI, also known as the "box isolation" technique, is used in integrated circuits to prevent electric current leakage between adjacent semiconductor device components. STI is generally used on CMOS process technology nodes of 250 nanometers and smaller. Older CMOS technologies and non-MOS technologies commonly use isolation based on "local oxidation of silicon" (LOCOS). STI is created early during the semiconductor device fabrication process, before transistors are formed. The key steps of the STI process involve etching a pattern of trenches in the silicon, depositing one or more dielectric materials (such as silicon dioxide) to fill the trenches, and removing the excess dielectric using a technique such as chemical-mechanical planarization.

Figure 10:
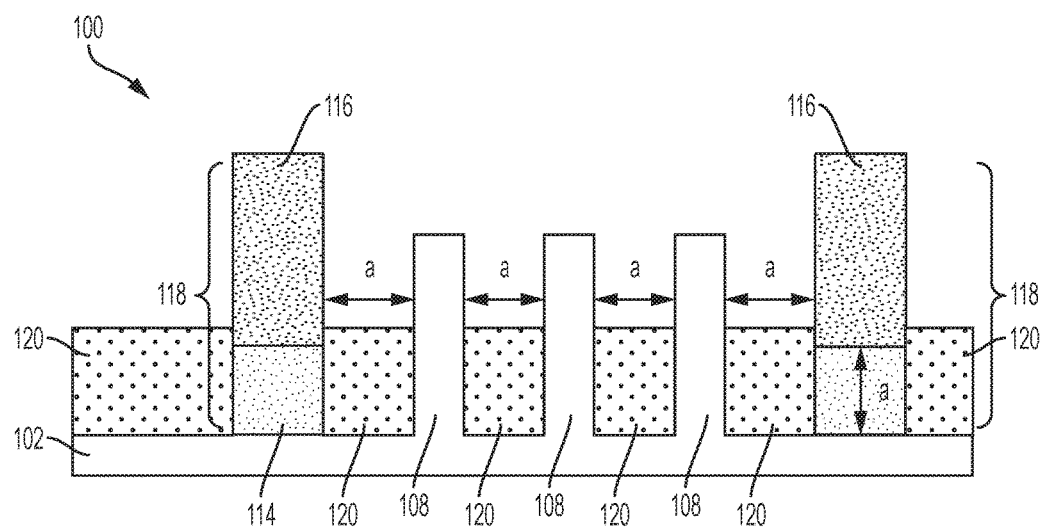
FIG. 10 depicts a cross-sectional view of the structure after removing portions of the STI material according to one or more embodiments of the present invention.

FIG. 10 depicts a cross-sectional view of the structure 100 after removing portions of the STI material according to one or more embodiments of the present invention. FIG. 10 is a continuation of the processes discussed in FIG. 9. The structure 100 is shown after removing a portion of STI material 120 through an etching process as discussed in FIG. 2. Note that due to unequal amounts of STI material 120 on either side of the dummy anchors 118, the dummy anchors 118 can bend, but the fins 108 will not bend as the tensional forces are equal. Once the STI material 120 has been deposited as described in FIG. 9, the dummy anchors 118 play no further role in the structure 100.

Figure 11:
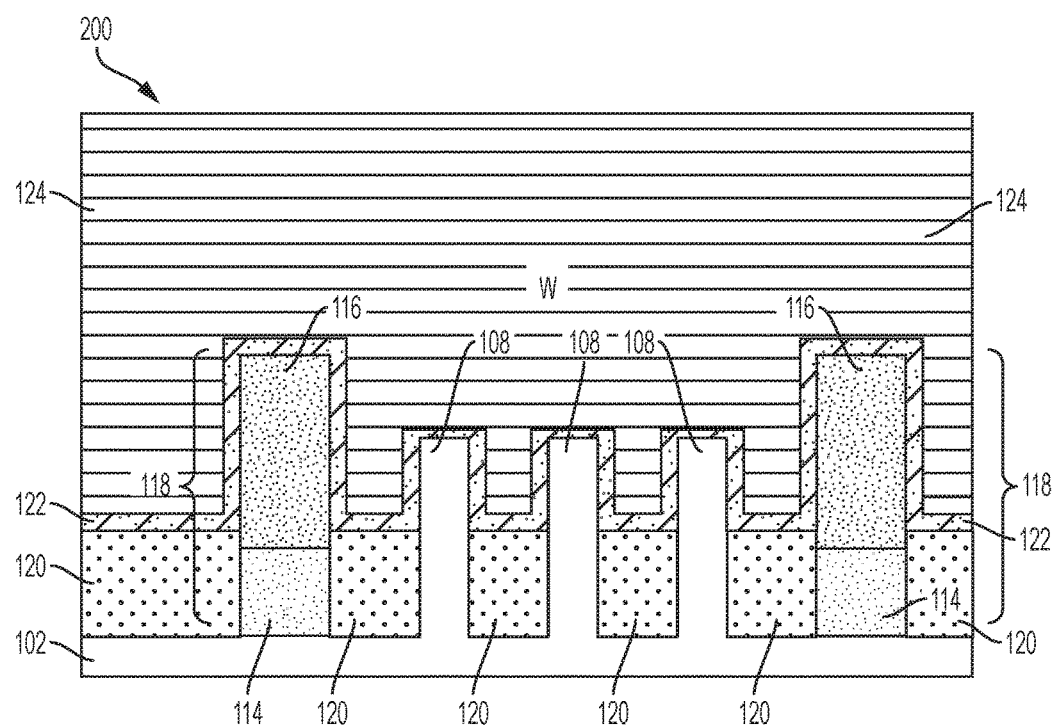
FIG. 11 depicts a cross-sectional view of the structure after adding a high-k insulator material and a metal contact layer according to one or more embodiments of the present invention.

FIG. 11 depicts a cross-sectional view of a structure 200 after adding a high-k insulator material and a metal contact layer according to one or more embodiments of the present invention. FIG. 11 is a continuation of the processes discussed in FIG. 10. In one or more embodiments, structure 200 shows the fins 108 and dummy anchors 118, with the fins 108 in proper orientation (e.g. not bent). In addition, a high-k insulator material 122 is conformally deposited onto the structure 200. The high-k insulator material 122 can include a single or multiple insulator materials, including but not limited to, silicon oxide, silicon oxynitride, silicon nitride, SiBCN, SiOCN, SiOC, and SiCN. The structure 200 also includes a metal contact layer 124 that is conformally deposited over the high-k insulator material 122. The metal contact layer 124 can further include a work function setting layer. The work function layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC) and combinations thereof. Non-limiting methods for forming contacts include depositing a dielectric material, patterning to form contact trenches, and filling the trenches with a conducting material.

Figure 12:
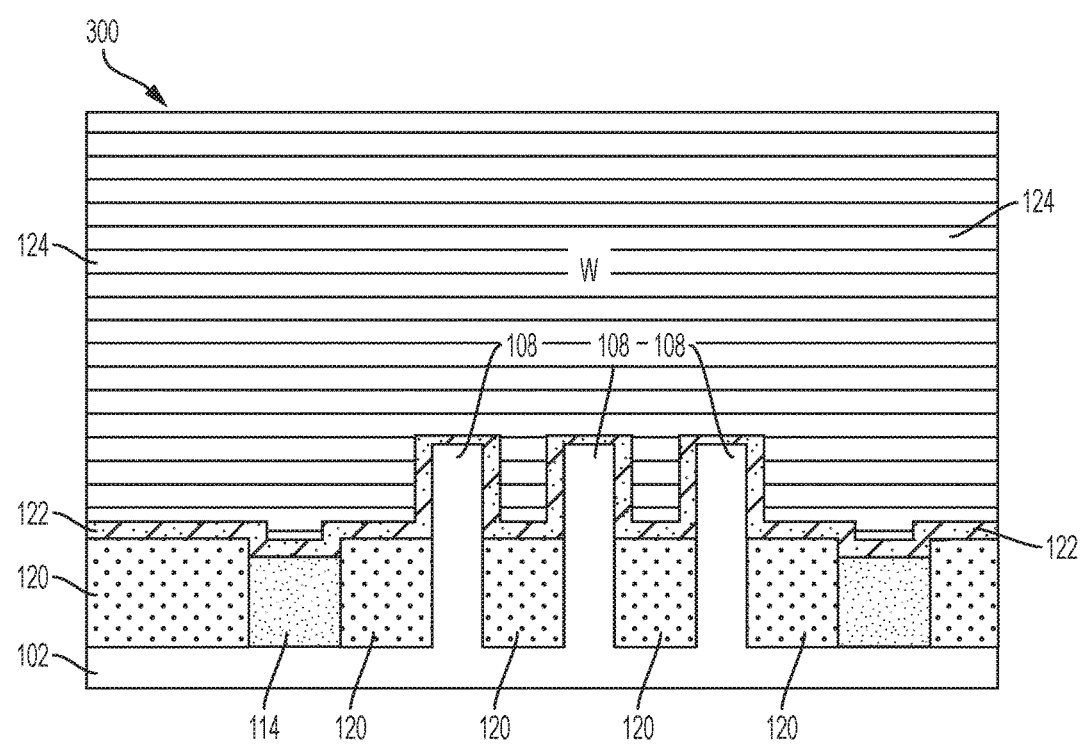
FIG. 12 depicts a cross-sectional view of the structure after removing portions of the dummy anchor and adding a high-k insulator liner and a metal contact layer according to one or more embodiments of the present invention.

FIG. 12 depicts a cross-sectional view of a structure 300 after removing portions of the dummy anchor and adding a high-k insulator liner and a metal contact layer according to one or more embodiments of the present invention. FIG. 12 is a continuation of the processes discussed in FIG. 10. FIG. 12 is similar to FIG. 11 but with portions of the dummy anchors 118 (of FIG. 10) removed. In one or more embodiments, structure 300 shows the fins 108 in proper orientation (e.g. not bent). For one or more embodiments, a further step of removing portions of the dummy anchors 118 (of FIG. 10) can be performed. Left unmodified, the dummy anchors 118 (of FIG. 10) can get in the way of other processes on the structure 300. FIG. 12 shows the structure 300 after the dummy anchors 118 (of FIG. 10) have been etched away in a process similar to one described in FIG. 2. In some embodiments, a planarization process can be performed to reduce the height of the dummy anchors 118 (of FIG. 10). In addition, the high-k insulator material 122 is conformally deposited onto the structure 300 as described in FIG. 11. The structure 300 also includes the metal contact layer 124 that is conformally deposited over the high-k insulator material 122 as described in FIG. 11. The metal contact layer 124 can further include a work function setting layer.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. Embodiment of the present invention have been presented for purposes of illustration and description, but is not intended to be exhaustive or limited to the form described. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The terminology used herein is for describing particular embodiments only and is not intended to be limiting of embodiments of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated integers, steps, operations, elements, and/or components, but do not preclude the presence or addition of one or more other integers, steps, operations, element components, and/or groups thereof.

While embodiments of the present invention have been described in detail in connection with only a limited number of embodiments, it should be readily understood that embodiments of the present invention are not limited to such described embodiments. Rather, embodiments of the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A method for forming a field-effect transistor (FET), the method comprising:
   forming a plurality of individual fins on a substrate;
   forming a dummy anchor structure, wherein the dummy anchor is located outside the outermost fin;
   defining a trench between the outermost fin and the dummy anchor, wherein the trench has a width dimension;
   depositing a shallow trench isolation (STI) material into the trench and between the fins, wherein the STI material places uniform tension stresses on both sides of the individual fins; and
   removing the dummy anchor structure after depositing the STI material.

2. The method of claim 1, wherein the trench width dimension is equal to a distance between adjacent fins.

3. The method of claim 1, wherein the trench width dimension is different than a distance between adjacent fins.

4. The method of claim 1, wherein the dummy anchor structure is comprised of a first liner material and a second liner material, and wherein the first liner material has a width dimension equal to the trench width dimension.

5. The method of claim 1, wherein the dummy anchor structure is comprised of a first liner material and a second liner material, and wherein the first liner material has a width dimension different than the trench width dimension.

6. The method of claim 1, further comprising performing an annealing operation to the substrate after depositing a STI material.

7. The method of claim 1, wherein the plurality of individual fins are formed by a self-aligned double patterning (SADP) or self-aligned quadruple patterning (SAQP) process.

8. The method of claim 1, further comprising depositing a high-k insulator layer over the substrate after depositing a STI material.

9. The method of claim 1, further comprising depositing a metal contact layer over the substrate after depositing a STI material.

* * * * *